United States Patent [19]

Davis et al.

[11] 4,011,470

[45] Mar. 8, 1977

[54] CIRCUIT UTILIZING OPEN-BASE TRANSISTOR AS LEAKAGE BYPASS DEVICE

[75] Inventors: William Folsom Davis, Tempe, Ariz.; Thomas Marinus Frederiksen, San Jose, Calif.

[73] Assignee: Motorola, Inc., Chicago, Ill.

[22] Filed: Mar. 25, 1976

[21] Appl. No.: 670,497

Related U.S. Application Data

[63] Continuation of Ser. No. 502,258, Aug. 30, 1974, abandoned, which is a continuation of Ser. No. 317,972, Dec. 26, 1972, abandoned.

[52] U.S. Cl. .............................. 307/297; 307/310; 307/315; 330/23; 330/40
[51] Int. Cl.² ........................................ H03K 1/12
[58] Field of Search ................. 307/297, 310, 315; 330/23, 40

[56] References Cited

UNITED STATES PATENTS

| | | |
|---|---|---|
| 2,991,424 | 7/1961 | Wolfendale .......................... 330/40 |
| 3,370,244 | 2/1968 | Higgenbotham .................... 330/23 |

*Primary Examiner*—Michael J. Lynch
*Assistant Examiner*—Joseph G. Clawson, Jr.
*Attorney, Agent, or Firm*—Charles R. Hoffman

[57] ABSTRACT

A floating base transistor connected within an integrated circuit to provide a high temperature high voltage low current bypass device having the same type of temperature dependence as the leakage current shunted therethrough. The bypass device is connected to provide its $I_{CEO}$ current as a current source through which a parasitic leakage current is diverted which would otherwise produce a base current of an output transistor which is supposed to be in the off condition. The parasitic leakage current includes the $I_{CEO}$ current of an opposite polarity driving transistor in the off condition having its emitter connected to a power supply and its base connected to an input circuit and its collector connected to the base of the output transistor. In one embodiment the floating base transistor is a PNP substrate transistor having its collector connected to ground, its emitter connected to the base of an NPN output transistor, and its base floating. The current of the floating base transistor is greater than the parasitic leakage current of a PNP driving transistor, so the NPN output transistor is held in the off position.

9 Claims, 4 Drawing Figures

CIRCUIT UTILIZING OPEN-BASE TRANSISTOR AS LEAKAGE BYPASS DEVICE

This is a continuation of application Ser. No. 502,258, filed Aug. 30, 1974, now abandoned, which was a continuation of Ser. No. 317,972, filed Dec. 26, 1972, now abandoned.

BACKGROUND OF THE INVENTION

1. Field of the Invention

The invention relates to circuits using very high resistance devices to bypass parasitic leakage currents to prevent the leakage currents from accidentally turning on transistors. In particular, the invention relates to circuits utilizing an open base transistor as a low current bypass device.

2. Description of the Prior Art

In integrated circuits, especially in linear integrated circuits, there are many situations wherein the base of an output transistor is driven by the collector of an opposite type transistor. For example, an NPN output transistor may have its base driven by the collector of a PNP transistor. In this case, when the PNP transistor is gated off no collector current flows therein, and the NPN output transistor is also off. However, the parasitic leakage current flowing out of the collector of the PNP transistor into the base of the NPN output transistor may cause an unacceptably large current to flow in the collector of the NPN transistor when it is supposed to be in the "off" condition. The parasitic leakage current may include several components, all of which increase exponentially with temperature. One of these components may be equal to the collector-base leakage current of the PNP transistor multiplied by the current gain beta. This is the well known $I_{CEO}$ leakage current from collector to emitter with base open. A more complete description of this leakage current characteristic is found in "Transistor Engineering," by Alvin B. Phillips, McGraw-Hill, 1962. Another component may be a second leakage current (which may be the $I_{CEO}$ leakage current of an NPN transistor having its collector driving the base of the above-mentioned PNP transistor) flowing into the base of the PNP transistor and multiplied by the beta thereof. The total leakage current flowing into the base of the NPN output transistor will then be multiplied by the beta of the output transistor, causing a unacceptably high collector current to flow when the NPN output transistor is supposed to be off. Because of the exponential increase of such leakage currents with temperature, the problem becomes critical at high temperatures if the leakage current flowing into the base of the NPN output transistor is not bypassed, or shunted to ground. For example, at 150° C, the total parasitic leakage current into the base of the NPN output transistor may be as high as 1 microampere. The beta of the NPN output transistor may be equal to 200, and so the resulting current flowing in the collector of the NPN output transistor, which is supposed to be off under the described conditions, may be as high as 200 microamperes. In most cases this current would be unacceptably large.

The most recent method of bypassing the above-mentioned parasitic leakage current away from the base of the NPN output transistor, thereby keeping its emitter-base junction reverse biased, is to connect a pinched resistor between the base of the NPN output transistor and the ground power supply. A pinched resistor normally consists of an elongated P-type diffused region having a contact at each end, and an N-type region diffused into the surface of the P-type diffused region which "pinches off" conduction along the surface thereof and forces the current through the pinched resistor to flow under the N-type region, thereby substantially increasing the effective resistance of the P-type diffused region. However, pinched resistors have several serious shortcomings for use as low current bypass devices as described hereinbefore. The current through a pinched resistor may decrease by a factor of approximately 2 as the temperature increases from −55° centigrade to +150° centigrade, whereas the parasitic leakage current required to be bypassed therethrough may increase by several orders of magnitude. Thus, the pinched resistor must be considerably lower in value than would be required if the current therein had the same temperature coefficient as the leakage current under discussion. Further, the pinched resistor typically has a breakdown voltage of only approximately 7 volts. This is a serious disadvantage, because in many situations it is desirable that the voltage on the base of the NPN output transistor be higher than 7 volts. In general, the leakage bypass device needs to have the characteristic that it holds the output device (i.e., the NPN output device) off when the driving device (i.e., the PNP transistor) is off, and yet does not rob the base drive from the output device when the driving device is on. The temperature coefficient of the leakage current from the driving device should be matched by the temperature coefficient of the current through the leakage shunt device.

The present invention solves these and other shortcomings of the prior art by providing a minimum sized low current bypass device which sinks the leakage current, and has approximately the same temperature coefficient as the parasitic leakage current, and has a high breakdown voltage, and which approximates a constant current source to a greater degree then a pinched resistor.

SUMMARY OF THE INVENTION

In view of the foregoing, an object of this invention is to provide a circuit having a high voltage low current bypass device therein for shunting parasitic leakage currents.

A further object of this invention is to provide a circuit having a low current bypass device of the type described having a positive temperature coefficient.

Yet another object of this invention is to provide a circuit having a low current bypass device of the type described which has higher breakdown voltage than prior art low current bypass devices.

Yet another object of this invention is to provide a circuit utilizing an open-base transistor as a low current bypass device of the type described.

Briefly described, the invention is a circuit utilizing an open base transistor as a high voltage low current bypass device having a temperature coefficient which approximately matches that of the parasitic leakage currents bypassed. In one embodiment of the invention, an input circuit drives a PNP transistor which has its collector connected to the base of an NPN transistor. The collector and emitter of the NPN transistor are connected to an output circuit. An open-base PNP transistor is connected to the base of the NPN transistor to bypass the parasitic leakage current therein to ground. In another embodiment, the above-mentioned open-base PNP transistor is replaced by an open-base NPN transistor which is connected to the base of the NPN transistor. In another embodiment an open-base transistor is connected to the base of the above-described PNP transistor to prevent leakage current flowing from the base of the PNP transistor to the input circuit from forward biasing the emitter-base junction thereof. In another embodiment an input circuit drives the base of an NPN transistor, which has its collector driving the base of a PNP output transistor having its emitter and collector connected to an output circuit. An open-base transistor is connected as a low current bypass device to the base of the NPN transistor, or, as another embodiment, to the base of the PNP transistor.

DETAILED DESCRIPTION OF THE INVENTION

Figure 1:
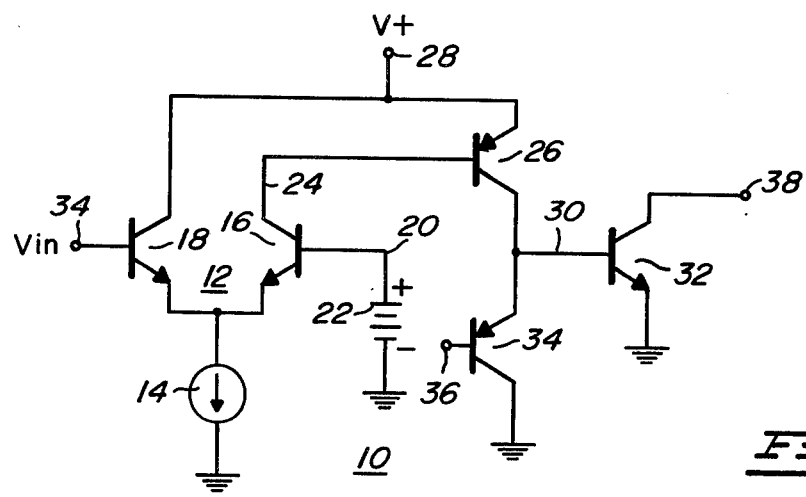
FIG. 1 is a schematic diagram of a circuit which is helpful in describing the invention.

FIG. 1 is a schematic diagram of an embodiment of the present invention which is useful in describing the operation thereof. The circuit shown in the schematic FIG. 1 is a voltage comparator circuit 10 which includes a differential input stage 12. Differential input stage 12 includes a current source 14 and a first and second emitter-coupled NPN transistors 16 and 18, respectively. The first NPN input transistor 16 has its base 20 connected to a reference voltage source 22 and its collector 24 connected to the base of a PNP transistor 26 having its emitter connected to positive power supply 28 and its collector connected to the base 30 of NPN output transistor 32. The base of the second NPN input transistor 18 is connected to the input voltage 34 of the voltage comparator circuit 10, and the collector of the second input NPN transistor 18 is connected to the positive power supply 28. Open-base substrate PNP transistor 34 has its emitter connected to base 30 of NPN output transistor 32 and its collector (the substrate) connected to ground and its base 36 electrically floating, (i.e., unconnected). The output terminal of voltage comparator 10 is the collector 38 of output transistor 32, which also has its emitter connected to ground.

A parasitic leakage current having two components may flow into the base 30 of NPN output transistor 32 when the PNP transistor 26 is gated off. This condition occurs when the input voltage on base 34 of NPN input transistor 18 is positive with respect to the reference voltage on base 20 of NPN input transistor 16. One of the components of the leakage current is equal to the collector-base leakage current of the NPN input transistor 16 multiplied by the beta of the PNP transistor 26. The other component is equal to the collector-base current of the PNP transistor 26 multiplied by the beta thereof, which is simply its $I_{CEO}$ current. Since open-base substrate PNP transistor 34 has its emitter connected to the base 30 of the NPN output transistor 32 and its collector (the substrate) connected to ground, the above-described parasitic leakage current is by-passed away from the base of the NPN output transistor 32.

Those skilled in the art will recognize that the PNP substrate transistor 32 will function effectively as a leakage bypass device if the $I_{CEO}$ leakage current thereof is substantially greater than the total leakage current flowing in the collector of PNP transistor 26. Those skilled in the art will further recognize that PNP substrate transistor may be replaced by an NPN transistor having its base floating, its emitter connected to ground and its collector connected to base 30 of NPN output transistor 32.

However, a substrate PNP transistor can be more efficiently used as a leakage bypass device, because the collector-base area is higher for a substrate transistor than for a conventional NPN transistor of the same physical size. This is because the collector-base junction includes the epitaxial layer-to-substrate bottom junction area and also the isolation channel diffusion junction area. Further, since the impurity doping levels are lighter, the leakage current per unit area will be greater. The low current beta for a substrate PNP transistor is quite high, typically ranging from 30 to 50. The low current beta for NPN transistors is typically also in this range. Thus, the $I_{CEO}$ leakage current will be higher for a substrate PNP than for an equal size vertical NPN transistor. A potential problem with floating base transistors exists if there is a leakage current flowing into the floating base. Such a leakage current will produce a collector current equal to said leakage current multiplied by the beta of the floating base transistor which will flow to ground through the collector and emitter of the floating base transistor. This current would rob an excessive amount of base drive current from the output device during its "on" condition. Thus, another advantage of a substrate PNP transistor is that it is unlikely that large parasitic leakage currents will flow out of the base, due to the low voltage typically thereon, so the floating base problem can usually be ignored if substrate PNP transistors are used as leakage bypass devices.

It should be recognized that the operation of a circuit as shown in FIG. 1 is improved if the low current bypass device has characteristics more resembling those of a constant current source than those of a resistor. This would be especially true if there were a resistor in series with the emitter of NPN output transistor 32, so that its base 30 could undergo large voltage excursions.

When the voltage Vin on base 34 of transistor 18 is lower than the voltage on base 20 of transistor 16, PNP transistor 26 is "on" and NPN output transistor 32 is "on". For a large voltage on base 30, a linearly resistive low current bypass device in place of PNP transistor 34 would rob an excessive amount of base current from NPN output transistor 32, thereby degrading circuit performance. However, a relatively constant current leakage bypass device would not have this undesirable effect.

Figure 2:
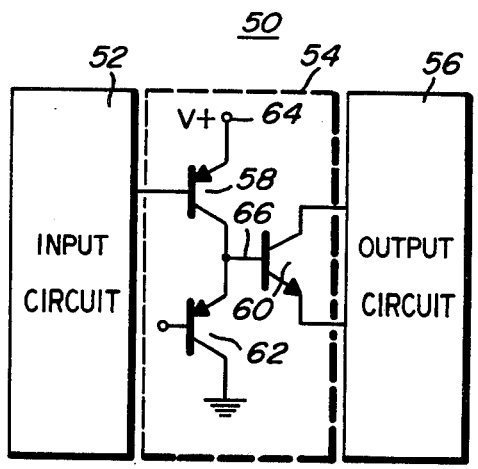
FIG. 2 is a schematic diagram of an embodiment of the invention.

FIG. 2 is a diagram of another embodiment of the present invention, wherein a circuit 50 includes an input circuit 52, a coupling circuit 54, and an output circuit 56. According to the present invention, coupling circuit 54 includes a PNP transistor 58, an NPN transistor 60, and an open-base PNP transistor 62. Input circuit 52 is connected to the base of PNP transistor 58 which has its emitter connected to a positive power supply 64 and its collector connected to the base 66 of NPN transistor 60. The emitter and collector of NPN transistor 60 are connected to output circuit 56. Open-base PNP transistor 62 has its emitter connected to the base 66 of NPN transistor 60 and its collector connected to ground. Alternatively, the bypass device may be an open base NPN transistor with its collector connected to the base 66 of NPN transistor 60 and its emitter connected to ground. In either case, the bypass device 62 prevents leakage current flowing out of the collector of PNP transistor 58 from flowing into the base of NPN transistor 60 and being multiplied by the beta thereof when PNP transistor 58 is off, and further ensures that the emitter-base junction of NPN transistor 60 is reverse biased, so that only the collector-base leakage current flows in the collector of NPN transistor 60.

Figure 3:
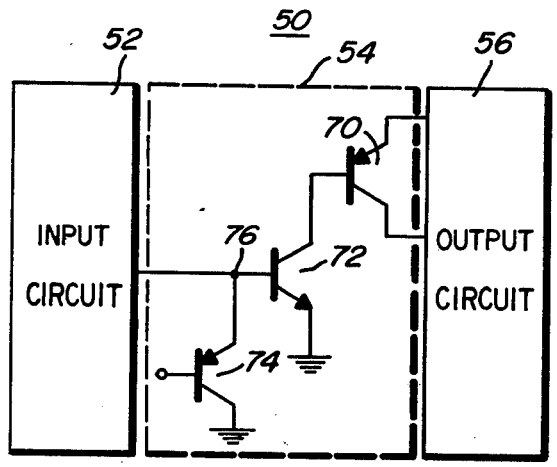
FIG. 3 is a schematic diagram of another embodiment of the invention.

FIG. 3 is a diagram of yet another embodiment of the present invention. Circuit 50 includes input circuit 52, coupling circuit 54 and output circuit 56. Coupling circuit 54 includes PNP transistor 70, NPN transistor 72, and open-base PNP transistor 74. Input circuit 52 is connected to the base 76 of NPN transistor 72, which has its emitter connected to ground, its collector connected to the base of PNP transistor 70, which has its emitter and collector connected to output circuit 56. Open-base PNP transistor 74 has its emitter connected to the base 76 of the NPN transistor 72 and its collector connected to ground, thereby providing a bypass device for the parasitic leakage current flowing from input circuit 52 into the base of NPN transistor 72, when the latter is gated off.

Figure 4:
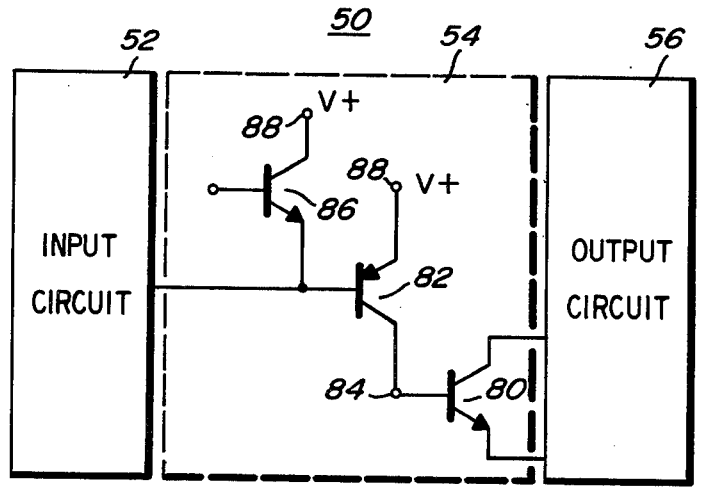
FIG. 4 is a schematic diagram of another embodiment of the invention.

FIG. 4 is a diagram of another embodiment of the invention. Circuit 50 includes an input circuit 52, a coupling circuit 54 and an output circuit 56. Coupling circuit 54 includes an NPN transistor 80, a PNP transistor 82, and an open-base NPN transistor 86. Input circuit 52 is connected to the base of PNP transistor 82, which has its emitter connected to positive power supply 88. The collector of PNP transistor 82 is connected to the base 84 of NPN transistor 80. The collector and emitter of transistor 80 are connected to output circuit 56. Open-base NPN transistor 86 has its collector connected to the base of PNP transistor 82 and its emitter connected to positive power supply 88, thereby functioning as a leakage bypass device which keeps the emitter-base junction of PNP transistor 82 reverse biased when transistor 82 is supposed to be off, so that neither an $I_{CEO}$ current or an amplified leakage current from input circuit 52 flows in the collector of PNP transistor 82.

While this invention has been shown in connection with several specific examples, it will be apparent to those skilled in the art that the spirit and scope of the invention extends to any circuit in which an undesired leakage current is bypassed through an open-base transistor.

What is claimed is:

1. An integrated circuit including first and second power conductors coupled thereto, a first transistor, and a second transistor having a base electrode coupled to input circuit means of said integrated circuit and having its emitter coupled to said first power conductor, and having its base connected to a collector of said first transistor, said first transistor having its emitter coupled to said second power conductor, said integrated circuit comprising open-base transistor means bypassing reverse leakage current flowing in said collector of said first transistor connected directly between said base of said second transistor and said first power conductor for holding said second transistor in an "off" condition over a wide temperature range when said first transistor is in an "off" condition.

2. The circuit of claim 1 wherein the first transistor is an NPN transistor.

3. The circuit of claim 2 in which the open-base transistor bypass means is a substrate transistor.

4. The circuit of claim 1 wherein the second transistor is a PNP transistor having its emitter coupled to said power conductor means.

5. The circuit of claim 1 wherein the open-base transistor is a PNP transistor having its emitter connected to the base of the first transistor.

6. The circuit of claim 1 wherein the first transistor is an NPN transistor and the open-base transistor is PNP transistor having its emitter connected to the base of the first transistor.

7. The circuit of claim 1 wherein the first transistor is a NPN transistor and the open-base transistor is an NPN transistor having its collector connected to the base of the first transistor.

8. The circuit of claim 1 wherein the first transistor is an NPN transistor and the open-base transistor is a PNP transistor having its collector connected to the base of the first transistor.

9. An integrated circuit comprising first and second power conductors coupled thereto, a first PNP transistor, and a second NPN transistor having a base electrode coupled to input circuit means of said integrated circuit and having its emitter coupled to said first power conductor and having its base connected to a collector of said first PNP transistor, said first PNP transistor having its emitter coupled to a second power conductor, open-base PNP substrate transistor means bypassing reverse leakage current flowing in said collector of said first PNP transistor connected directly between said base of said second NPN transistor and said first power conductor for holding said second NPN transistor in an "off" condition over a wide temperature range when said first PNP transistor is in an "off" condition.

* * * * *